(12) United States Patent
Fan et al.

(10) Patent No.: US 6,495,813 B1
(45) Date of Patent: Dec. 17, 2002

(54) MULTI-MICROLENS DESIGN FOR SEMICONDUCTOR IMAGING DEVICES TO INCREASE LIGHT COLLECTION EFFICIENCY IN THE COLOR FILTER PROCESS

(75) Inventors: Yang-Tung Fan, Shin-Chu; Bii-Cheng Chang, Hsin Chu; Sheng-Liang Pan, Hsin-Chu; Kuo-Liang Lu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/414,926

(22) Filed: Oct. 12, 1999

(51) Int. Cl.⁷ ............................................... H01L 27/00
(52) U.S. Cl. .................... 250/208.1; 250/216
(58) Field of Search .......................... 250/208.1, 216, 250/226; 257/290, 291, 431–437

(56) References Cited

U.S. PATENT DOCUMENTS

| | | | | |
|---|---|---|---|---|
| 5,306,906 A | * | 4/1994 | Aoki et al. | 250/208.1 |
| 5,336,367 A | | 8/1994 | Nomura | 156/655 |
| 5,436,453 A | * | 7/1995 | Chang et al. | 250/338.1 |
| 5,672,519 A | | 9/1997 | Song et al. | 437/3 |
| 5,877,040 A | | 3/1999 | Park et al. | 438/70 |

* cited by examiner

Primary Examiner—Que T. Le
(74) Attorney, Agent, or Firm—George O. Saile; Stephen B. Ackerman (57) ABSTRACT

Multi-microlens arrays for optimizing light collection efficiency in CCD/CMOS solid-state color image cameras with L-shaped or non-regular photodetector areas are disclosed. Microelectronic fabrication methods for forming planar array multi-microlenses comprised of elements consisting of lens-pairs, integrated with color-filters, and compatible with CMOS high-volume manufacturing are taught. Experimental results demonstrating the processes for fabrication of multi-microlenses for L-shaped and for non-regular sensing areas are given.

22 Claims, 7 Drawing Sheets

MULTI-MICROLENS DESIGN FOR SEMICONDUCTOR IMAGING DEVICES TO INCREASE LIGHT COLLECTION EFFICIENCY IN THE COLOR FILTER PROCESS

BACKGROUND OF THE INVENTION (1) Field of the Invention

The present invention relates to the optical design and microelectronic fabrication of microlens arrays for the optimization of spectral collection efficiency and related photodetector signal contrast in the color filter process of semiconductor imaging devices.

(2) Description of Prior Art

Image sensors for color digital still and analog or digital video cameras are typically charge-coupled device (CCD) or complementary metal-oxide semiconductor (CMOS) photodiode array structures which comprise a spectrally photosensitive layer below one or more layers comprised of an array of color filters and a plane-array of microlens elements. The elementary unit of the imager is defined as a pixel, characterized as an addressable area element with intensity and chroma attributes related to the spectral signal contrast derived from the photon collection efficiency of the microlens array, spectral transmission or reflection properties of the color filter array materials, and spectral response and electrical noise characteristics of the photodetectors and signal processing train.

The ability of a sensor to capture images in low-level irradiance conditions is critical in applications. The primary attributes of the sensor that determine its ability to capture low-level image light are the geometrical optics of the lens arrangement, fill-factors of lenses and photodiodes, and, the photoelectron quantum efficiency of the semiconductor in which the photodiodes are fabricated. The quantum efficiency is a measure of the photon-to-electron conversion ratio, and, for most CCD's these quantum efficiencies are similar. But, the physical size of the photosensitive area, coupled with the geometry of the lenses for collecting light and imaging this light onto the useful photosensitive area, create superior or inferior solid-state imagers. Responsivity is a measure of the signal that each pixel can produce and is directly proportional to pixel area. Another benefit of increased responsivity is that less illumination is needed to achieve a desired signal- to-noise contrast. With low-level illumination, the image will appear less grainy, and, the imager's frame rate can also be increased, providing increased video rates.

The optical performance of a solid-state imager is seen to depend on pixel size. Pixel size also affects the interaction of the camera lens with the microlens array. The microlens on top of each pixel focuses light rays onto the photosensitive zone of the pixel. The microlens significantly increases responsivity but it also limits the angular range of good responsivity. Typically, a 5-micron pixel has a severe drop in responsivity at 5 degrees from normal incidence. This leads to an optical effect whereby pixels near the edge of the camera lens field of view collect light less efficiently than at the center. This effect is reduced with larger 9-micron pixels, which have high responsivity at angles out to 15 degrees or more. Truncation of illuminance patterns falling outside the microlens aperture results in diffractive spreading and clipping or vignetting, producing nonuniformities and a dark ring around the image. Larger pixels use more silicon area which drives up the solid-state imager device manufacturing cost. The size of the active area can be set to optimize three factors: low light sensitivity, overall sensor size, and, the size of the optics necessary to project the desired image over the entire array. Instead of increasing the active area, some sensor manufacturers add extra steps to the manufacturing process to apply a microlens over each pixel. A microlens captures most of the incident light and focuses it onto the active area, which increases the effective fill ratio. The trade-off is, therefore, between the added cost of the microlens processing steps and the cost of the larger active areas. Typically, a pixel with a microlens requires a narrower incident light angle than a pixel that does not use a microlens, imposing additional optical design implications for the lens of the camera.

Associated with the microelectronic fabrication processes and materials used in forming solid-state array imagers, there often results gradients of spectral sensitivity and/or responsivity across the individual sensor elements comprising the imaging matrix, as well as related variations from sensor to sensor. The intrasensor variation and the intersensor variation are convolved with the imaging optics of the camera and the microlens arrays overlaying the photodiode arrays, such that the resultant contrast or modulation transfer function which manifests itself as an optoelectronic signal distribution mapping the illuminance distribution of the image formed across the imager-array surface, is an electronic signal contrast function which is fed into an electronic signal processing train which again further convolves noise and other contributions into the output of the imager. In particular, the regions within and between pixels which suffer significant variations ranging from peak sensitivity and responsivity to "dead zones" of practically no photosensitivity, or, vignetted light from the optics which truncated and diffracted the original image light-intensity distribution function, direct the attention of solid-state imager designers to improve the geometrical optical configurations to optimize light collection to focus images onto active areas. More particularly, in cases where sensing areas are formed into non-regular or L-type geometries, conventional microlens designs typically yield relatively low light collection efficiencies and result in degraded optoelectronic signal contrast. Images formed may suffer from known types of classical lens aberrations, produce motional smearing, pixel gaps, or, have other significant undesirable effects on image quality. Practical, manufacturable imaging arrays must, therefore, be designed to increase flexibility in the layout of the imaging device. Central to this goal is the optimization of the design of the multi-microlens array configuration geometry and the formation process steps for the microelectronic fabrication of these optics overlaying the photodiode elements in the matrix comprising the solid-state imager. Variations in lens curvature, index of refraction, and, light-scattering centers in the materials which are caused to flow to form the microlens arrays will combine to determine the resultant image quality and signal strength. Unless the microlenses are ideally diffraction- limited, imager defects will always be introduced in practical situations.

Figure 1A:
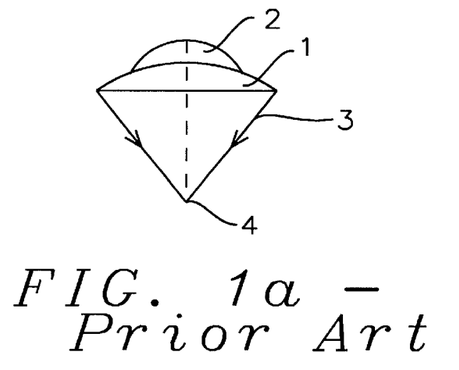
FIGS. 1(a),(b),(c) depicts the single simple and single compound lenses of Prior Art.
Figure 1B:
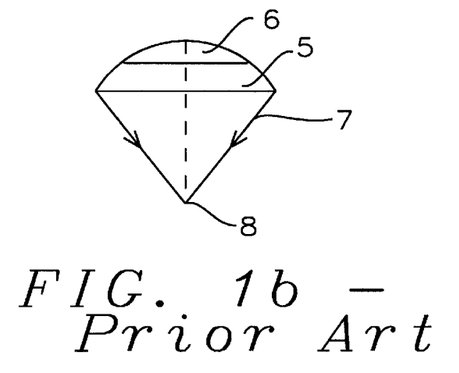
Figure 1C:
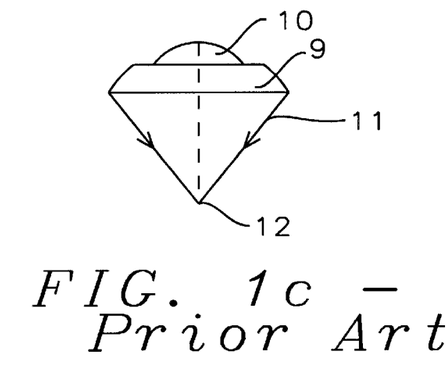

The design and fabrication of the multi-microlens arrays over the microelectronic photosensors of the solid-state imager, with enhanced optical collection efficiency for non-regular and L-shaped sensing areas, is thus a goal to which the present invention is directed. In conventional configurations for the color-filter process, only one microlens covers one pixel, and, the center of the microlens is aligned to the center of the pixel. It is, therefore, another goal of the present invention to disclose multi-microlens structures and configurations suitable for L-shaped and non-regular sensing areas applicable to manufacturing CMOS and CCD image devices. Park et al in U.S. Pat. No. 5,877,040 shows a CCD with a convex microlens formed integrally on the planarization layer above a photodiode element of a CCD array such that the focal-distance of the lens may be positioned by adjustment of the microelectronic fabrication process of intervening film-layer thicknesses. By fixing the irradiance pattern comprising the image on only the photodiode, image smear caused by the photoelectric effect when diffracted peripheral light is incident on the interpixel regions is said to be minimized. The microlens formation process described is derived from the flow of a microlens material which flows thermally at 100 degrees to 200 degrees Centigrade. Following a dry-etch step of the substrate, the set of convex microlenses are formed in a second planarization layer above a first planarization layer containing color filters. The light receiving area of the photodiode is increased as compared with the conventional CCD because the photodiode is formed in an overlay with the microlens. However, rheological and surface physical processes, such as those taught by Park et al, wherein flow and surface tension are required to form a matrix of convex microlenses, are not consistent with the formation of irregular shapes to overlay to irregular or L-shaped photodiode geometries. Similarly, Song et al. in U.S. Pat. No. 5,672,519 teaches an image sensor device with a compound regular-shape microlens which extends conventional prior art from square to rectangular illuminance areas to account for CCD structures where the dimensions of a unit pixel or photodiode are different in the vertical and horizontal directions of the semiconductor. Song et al accomplish their extension of the prior art by two successive iterations of the conventional melt and flow process to cascade a contiguous upper lens of different curvature and/or refractive index on a first, lower lens to accommodate the dimensional mismatch of the pixel (photodiode). The fabrication method consists of forming lens shapes by carrying out patterning of transparent photoresist having a refractive index of 1.6 and melting it to cause flow which, under surface tension, results in a mosaic of hemispherical convex lense array elements. Simple convex and compound convex lens classes representative of Prior Art are shown in FIG. 1(a), FIG. 1(b). and FIG. 1(c). In FIG. 1(a), a first hemisherical lens element 1 of a two-dimensional array of microlenses is formed in the manner described above. A successive polymer, resin, or photoresist film coating is conformally applied, photolithographically patterned, thermally reflowed and/or dry-etched. The second-layer photomask and thermal and surface tension conditions of the first microlens 1 array-plane determine the curvature and thickness of the second tandem microlens array-elements 2. The compound lens in FIG. 1(a) is shown comprised of first lens 1, second lens 2, forming light-cone 3 converging to focal point or area 4. FIG. 1(b) shows a planarized first lens 5 with second lens 6 forming a compound lens converging image light-cone 7 to focal area 8. In FIG. 1(c) first microlens 9 is again planarized but also faceted by etching, and second lens 10 is conventionally formed to comprise the compound lens to converge image light-cone 11 to focal area 12. Curvature control is difficult even for a single fabrication step, and, all the determinents of variance that apply to the single step apply a fortiori to the iterated process forming the compound lens. The final structure achieved by Song et al produces parallel stripes of microlenses across a base mosaic of microlenses, which can be planarized to provide a flat surface for the second lens array-plane. In all cases of the Prior Art it is observed that single simple or single compound microlens arrays, with a mapping of the single microlens, simple or compound, to a single pixel or single photodiode sensing area in the imager. The limiting numerical aperture or f-stop of the imaging camera's optical system is that of the smallest aperture element in the convolution train. Therefore, it is observed that the Prior Art represented in FIGS. 1(a) and (c) have in common the further limitation of the light collection capability of the larger numerical aperture first (lower) microlens element by the addition of the second tandem microlens element (upper) which preceeds it.

Spherical aberrations, coma, light scattering, numerical aperture variations, vignetting, reflective losses at interfaces, multibounce stray light, cross-talk and other optical defects described by the modulation transfer function of the upper lenses are convolved with the lower or base lenses modulation transfer functions having their own analogous set of defects. L-shaped and irregular-shaped pixels remain problems not solved by the methods taught by Song et al.

U.S. Pat. No. 5,336,367 to Nomura attempts to eliminate flicker and other image defects by constraining the color-filter layer distance to the light sensing element, avoid color filter cracks due to thermal impact and enhancing reliability by creating the color-filter using an etch-resistant layer as a mask, and, forming a mosaic array of microlenses on the etch-resistant layer. The manufacturing process described is limited to forming hemispherical convex lenses and, therefore, subject to the same set of limitations of the conventional structures and fabrication processes described herein.

Figure 2A:
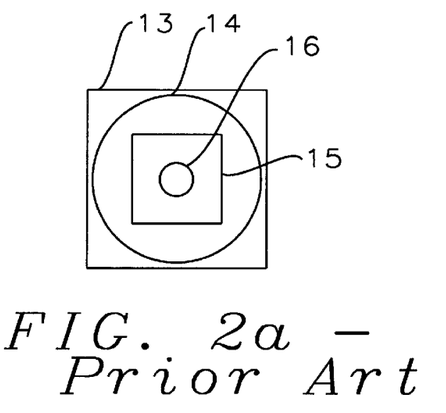
Figure 2B:
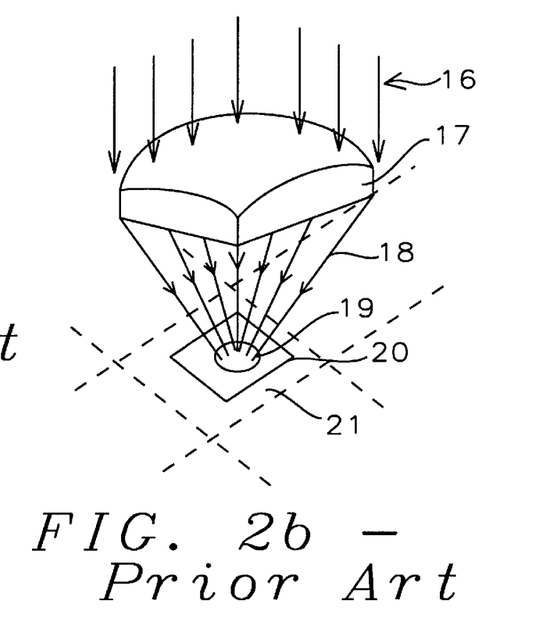
Figure 3A:
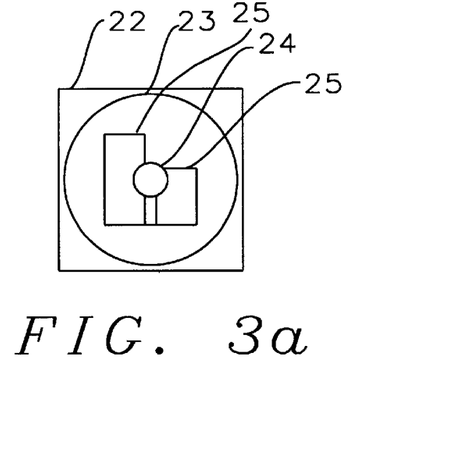
FIGS. 3(a),(b) exhibit the optics problem of single lens imaging onto non-regular photosensor areas within a square pixel.
Figure 3B:
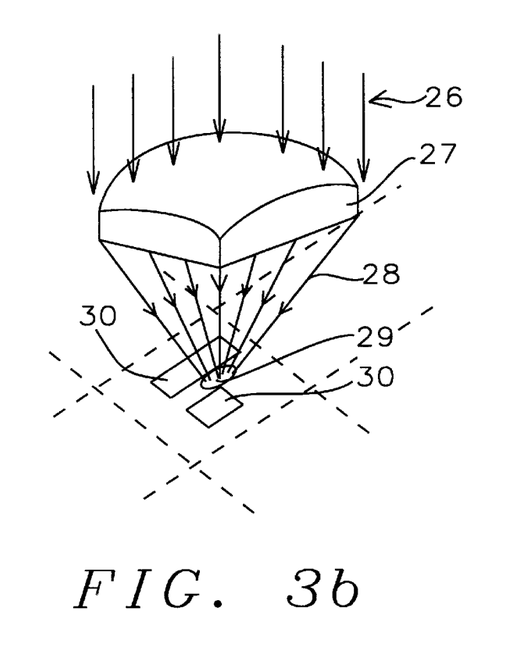
Figure 4A:
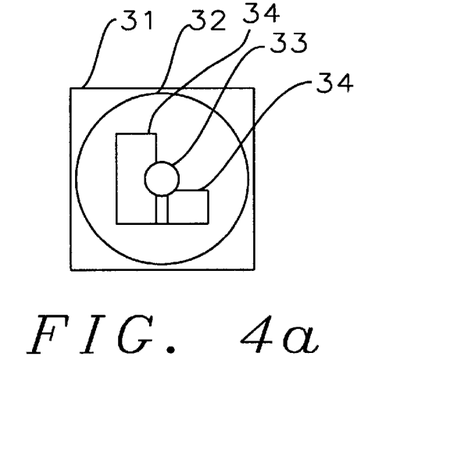
FIGS. 4(a),(b) illustrates the optics problem of single lens imaging onto L-shaped photosensor areas within a square pixel.
Figure 4B:
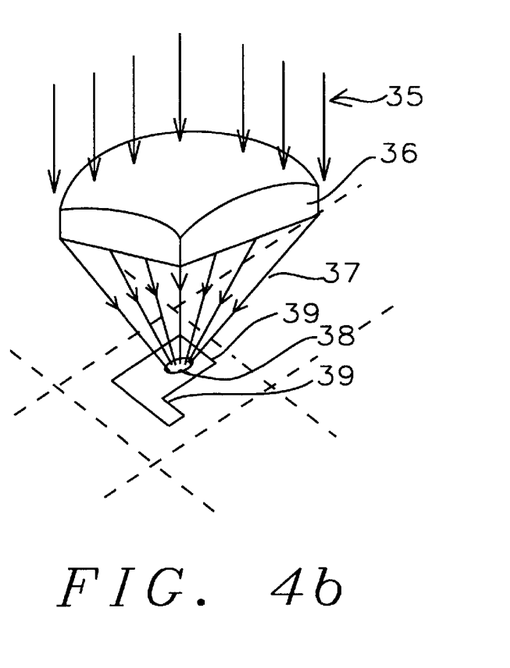

FIG. 2(a) depicts conventional geometric relationships between a square pixel 13, aperture 14 of a microlens element orthogonally projected onto a pixel, active sensing area 15 of a photodiode, and an area of a circle 16 of a microlens focal "point" for converging incident light to fall onto the center of a pixel in the plane of a photodiode. FIG. 2(b) illustrates the geometrical optics for incident image light 16 converged by microlens element 17 into focal cone 18 to the focal area 19 within a photoactive area 20 surrounded by a dead or non-photosensitive area 21. FIG. 3(a) and FIG. 3(b) illustrate the case where the photosensing area is a non-regular geometry. Shown in FIG. 3(a) is a square pixel 22 in which is inscribed the aperture stop 23 of the microlens which has focussed the incident image light into focal area 24 in the gap between the split non-regular sensing area 25. FIG. 3(b) exhibits the geometrical optics for incident image light 26 converged by microlens element 27 into focal cone 28 to the focal area 29 in proximity to a non-regular photoactive area 30. FIG. 4(a) and FIG. 4(b) illustrate the case where the photosensing area is L-shaped. Shown in FIG. 4(a) is a square pixel 31 in which is inscribed the aperture stop 32 of the microlens with focal cone cross-sectional area 33 in the L-shaped photodiode area 34. FIG. 4(b) shows the incident image irradiance 35 focussed by microlens 36 into focal cone 37 converging at focal area 38 onto or in proximity to the L-shaped photosensing area 39.

SUMMARY OF THE INVENTION

A principal object of the present invention is to provide classes of multi-microlens optical structures, configurations, arrangements, and combinations with spectral color-filters that maximize collection-efficiency of optical radiation patterns of images superimposed on the surface of semiconductor array imaging devices with non-regular and L-shaped sensing areas to achieve optimum color pixel resolution.

Another object of the present invention is to provide a manufacturable method and fabrication process which minimizes the number and task-times of the operational steps required in the production of semiconductor array color-imagers in accord with the principal object of the present invention.

Another object of the present invention is to provide multi-microlens design structures and fabrication methods that are practical for high reproducibility, reliability, and, consequently maximum yield and minimum production cost.

A further object of the present invention is to increase flexibility of the design and layout of color-imaging devices.

In accordance with the objects of this invention, classes of multi-microlens optical constructs which can be combined with either conventional or novel color-filter fabrication sequences for CCD,CID and CMOS array imaging devices are taught. To practice the method of the present invention, conventional microelectonic fabrication techniques using photolithograhic materials, masks and etch tools are employed: in succession the array of pn-junction photodiodes is patterned with impurity dopants diffused or ion-implanted, isolated, planarized over, and, typically three more layers are built up additively with primary red, green, blue color-filters formed by the addition of suitable dyes appropriate to the desired spectral transmissivity to be associated with specified photodiode coordinate addresses in the imager matrix.

Single chip color arrays typically use color filters that are aligned with individual columns of detector elements to generate a color video signal. In a typical stripe configuration, green filters are used on every other column with the intermediate columns alternatively selected for red or blue recording. Various combinations and permutations of color-filter sequences or color-filter "masks" are possible, and, a number of microprocessor algorithms exist for balancing color components in the synthetic reconstruction of color images.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIGS. 2(a,(b) illustrate the geometric optics factors for microlens imaging onto the photosensitive area within a square pixel, practiced in Prior Art.

FIGS. 8(A–D) demonstrate the experimental result of fabricating a matched multi-microlens array for L-shaped sensing areas.

FIGS. 9(A–D) exhibit the experimental result of fabricating a matched multi-microlens array for non-regular shaped sensing areas.

DESCRIPTION OF THE PREFERRED EMBODIMENTS

Figure 5:
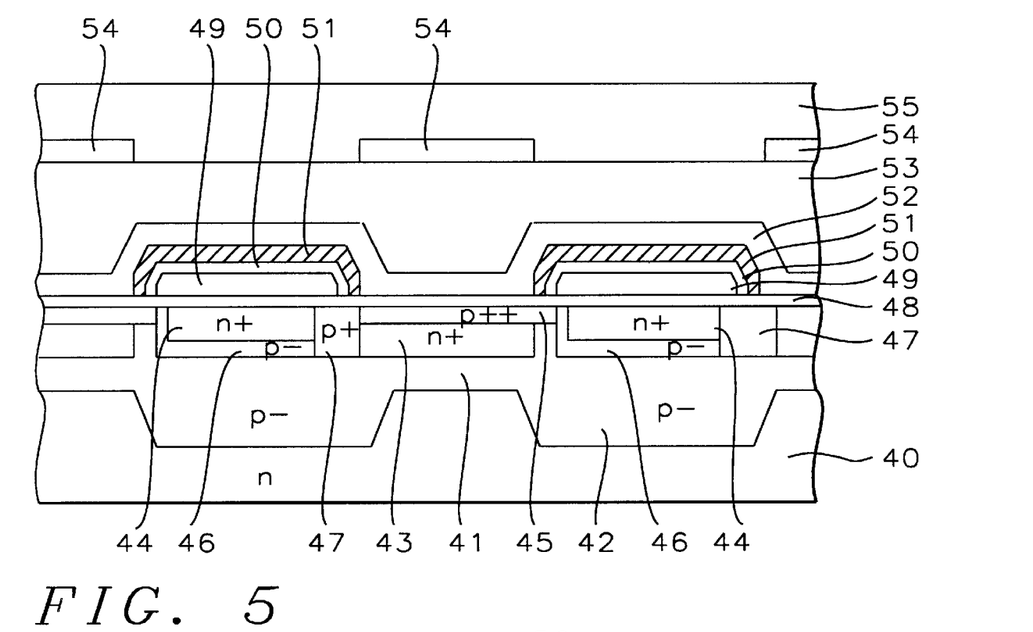
FIG. 5 is a schematic cross-sectional representation of the vertical and horizontal semiconductor device structures typical of CCD imagers with color-filters.

The present invention contemplates and is in no physical way limited by the variations in the sequences or configurations of the combinations of color-filters and multiple microlens arrays. FIG. 5 is a cross-sectional view of a representative CCD photodiode array. An "n" (negative) type semiconductor substrate 40 is photolithographically patterned by suitable photoresist coating, masking, exposing and developing, to open regions for ion-implant or diffusion doping by selected impurity atoms to form p– (weakly doped positive) type wells 41 and 42.

With similar photolithography steps, ion-implants or diffusions, an n+ type region 43 is formed to create a pn-junction photodiode and a vertical charge coupled device 44. A highly doped positive impurity, p++, is introduced selectively to form a surface isolation layer 45, and, a p– type well 46 is formed to isolate the CCD device 44. To isolate pixels, a p+ channel stop 47 is formed. The gate insulator 48 is then applied over the surface of the substrate. The vertical profile is completed by processing successive additions of transmission gate 49, interlevel insulator 50, light-shielding layer 51, passivation layer 52, planarization layer 53, first color-filter layer 54, planarization layer 55, and not shown, a second color-filter layer and final planarization layer on which a microlens array-plane is formed.

The optical structures of the present invention can be provided by conventional microelectronic fabrication means, including but not limited to, photolithographic additive and subtractive techniques, wet and dry etching, dye additions, optical spectroscopic and radiation exposures, and, others. The fabrication examples described here are illustrative of current manufacturing methods for creating the multi microlens arrays as preferred embodiments.

In the case where the photosensing area is non-regular or L-shaped, the semiconductor cross-sections viewed along orthogonal horizontal axes will look different. Referring to both FIG. 5 and, more particularly to FIG. 6, the pn-junction 43 comprising the photoactive region is simplified to a rectangle in FIG. 6(a) for the horizontal view looking perpendicularly at the x-axis, and, is simplified to a square in FIG. 6(b) for the photoactive region in the transverse horizontal view looking along the x-axis. Also shown is a representative configuration for a case of two color-filter layers, typically alternating or staggering an upper plane of red 56 with a lower plane of green 54 transmission filters, on a semiconductor substrate 40.

Figure 6A:
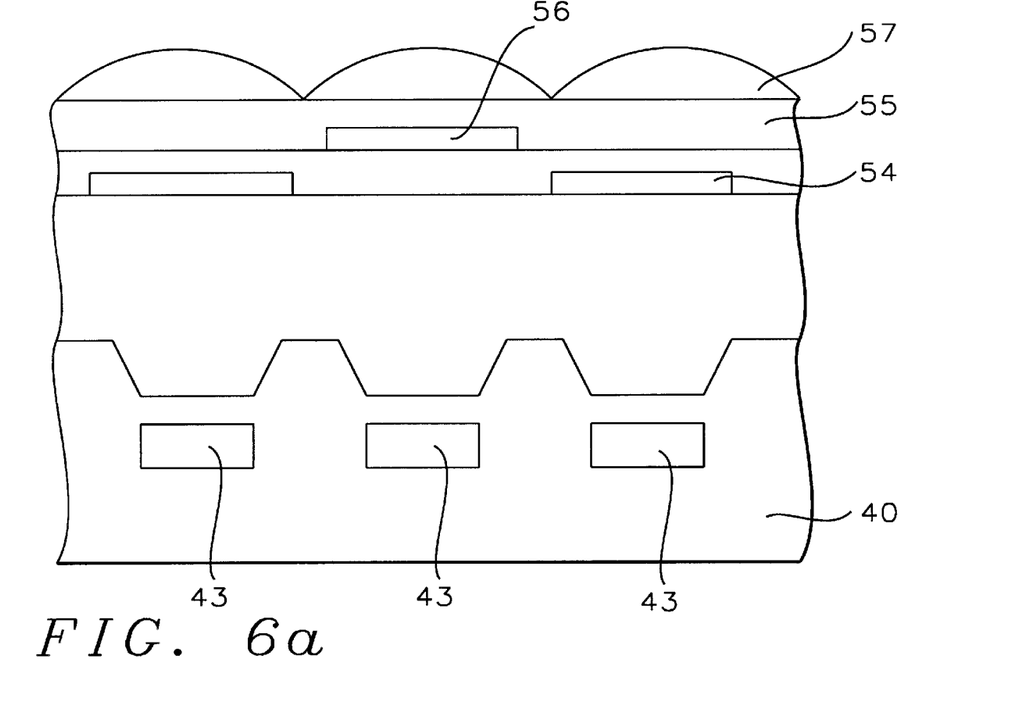
FIGS. 6(a),(b) elicits the differences in cross-sections of a semiconductor imager whose photosensing area is L-shaped when viewed along orthogonal horizontal axes.

The photolithographically self-aligned multi-microlens array-plane 57, formed conventionally, collects the image irradiance distribution from the camera's optical train and converges the light onto the photosensitive area comprising the longer vertical line of the "L" region, schematically represented by the rectangle 43 in FIG. 6(a). Correspondingly, a second (multi) microlens element 58 coplanar with microlens element 57, and formed simultaneously as a pair, collects image light and converges it onto the shorter, horizontal line of the "L" region, shown as the component 43 in FIG. 6(b).

Figure 6B:
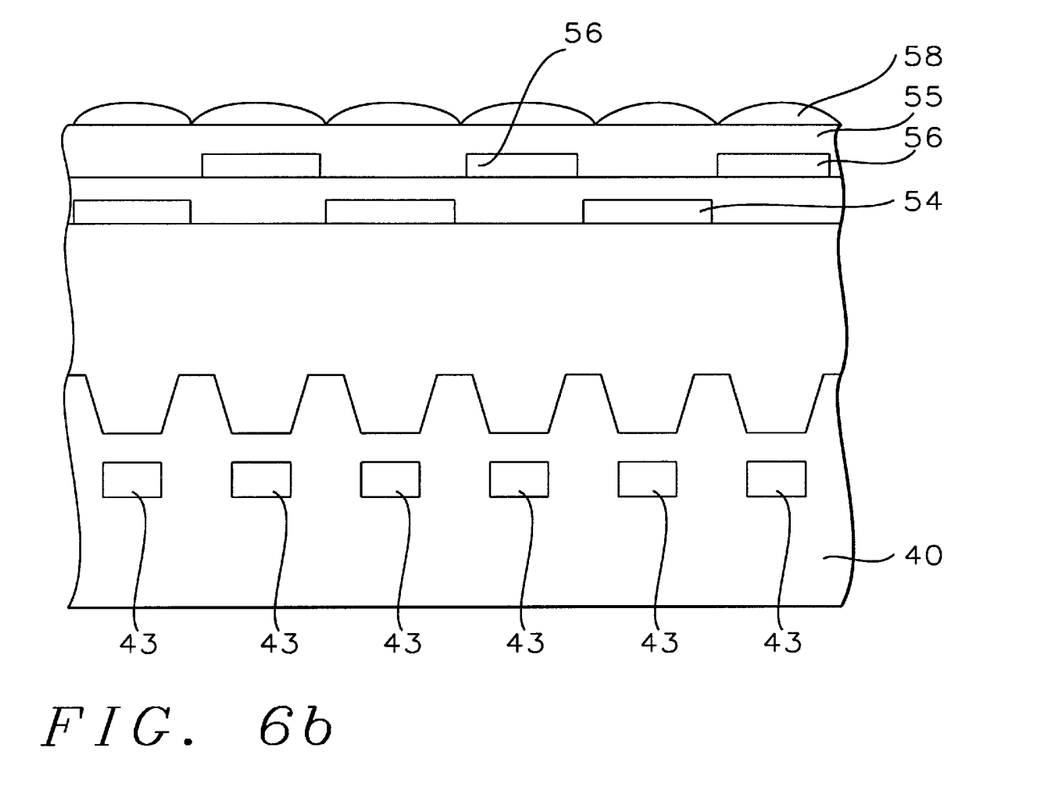
Figure 7:
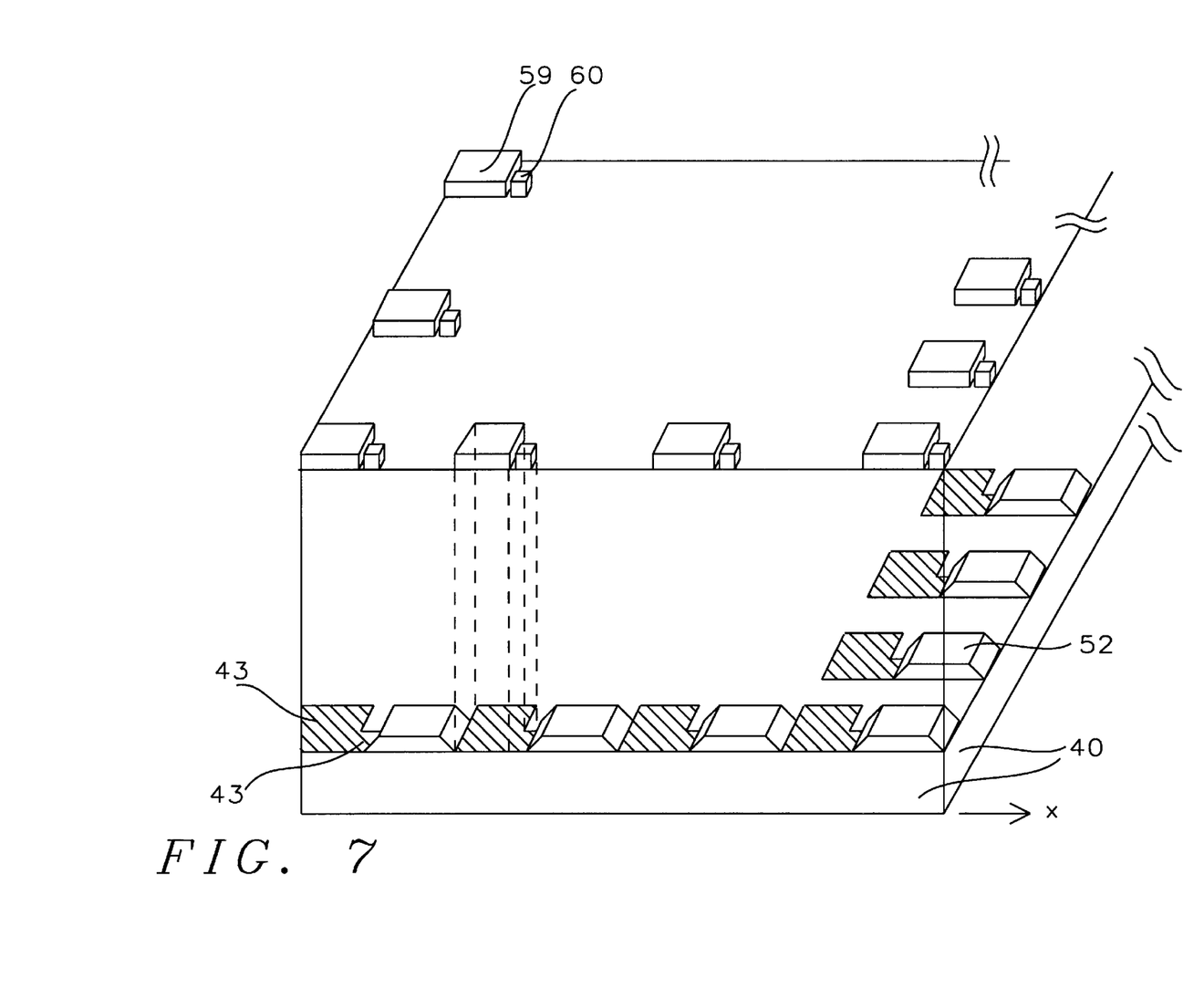
FIG. 7 shows the isometric perspective of the L-shaped photosensing area imager with orthogonal projections to the multi-microlens array-plane after lithography but before thermally induced reflow to form the lens array.
Figure 8A:
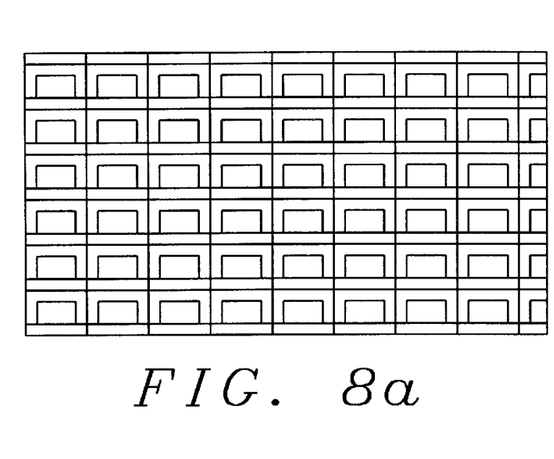
Figure 8B:
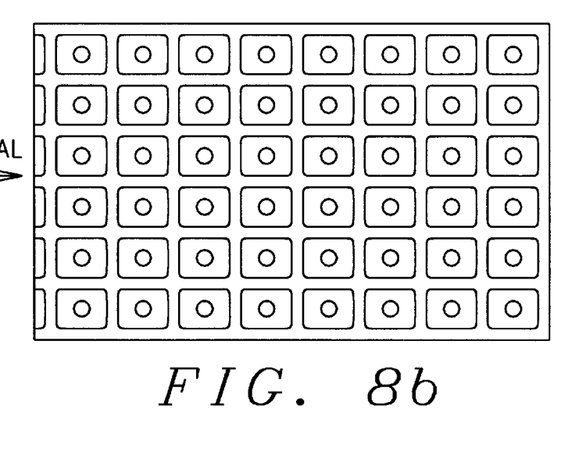
Figure 8C:
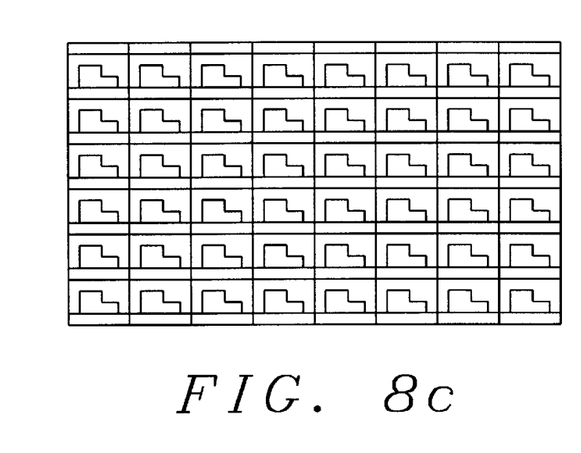
Figure 8D:
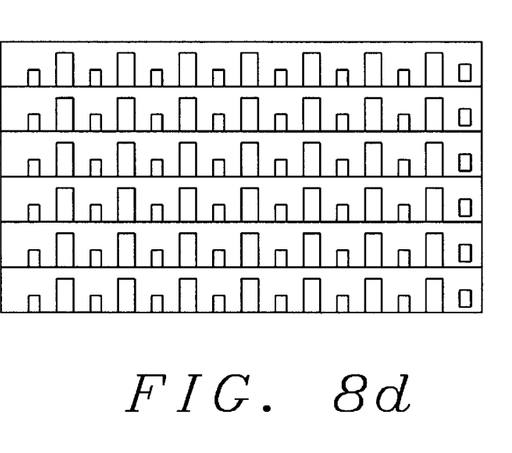
Figure 9A:
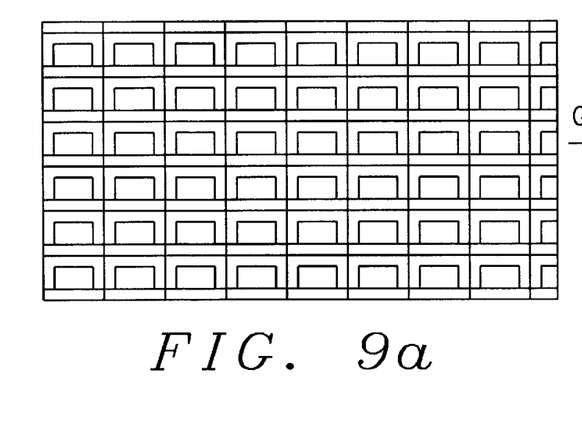
Figure 9B:
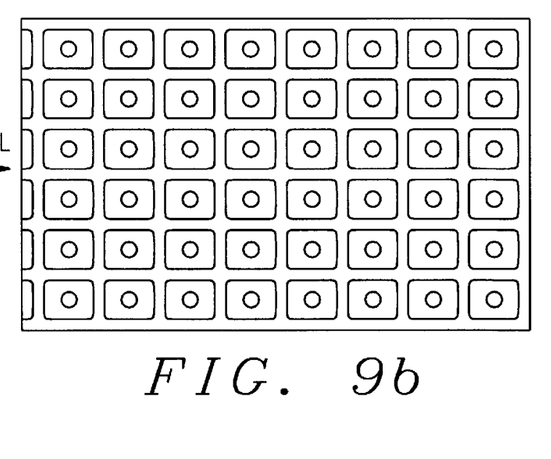
Figure 9C:
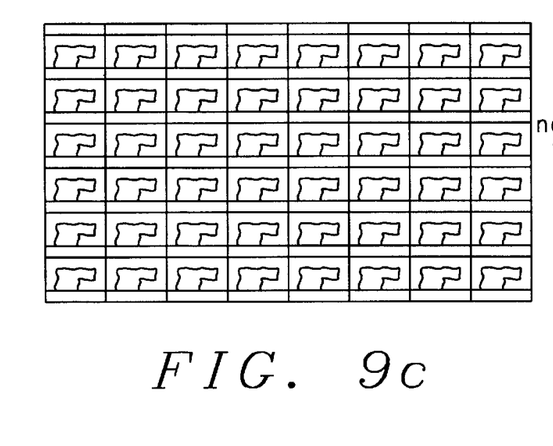
Figure 9D:
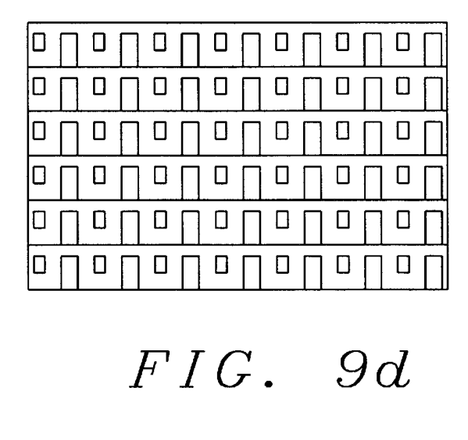

When we synthesize the two views schematically shown in FIG. 6(a) with FIG. 6(b), prior to the thermal reflow step, but after the photolithographic formation of the germinal pair of "L" shaped structures which will become the 2-element (multi) microlens array plane, we have the result shown in the isometric view of FIG. 7. Shown in FIG. 7 are the precursors 59 to microlens element 57 of FIG. 6(a), almost contiguous with the precursors 60 to microlens element 58 of FIG. 6(b). It is a preferred embodiment to minimize the separation distance between the paired elements both as precursors to microlens array formation induced during thermal flow, and, in the solidified phase as a pair of microlenses following flow. In this preferred embodiment, maximum overlap of light collection minimizes "dead" zones within L-shaped areas 43.

Exactly analogous to the case of the L-shaped areas of photosensitivity is the more general case of non-regular areas of photosensitivity. The same microelectronic fabrication processing is applicable to non-regular photosensitive areas, with the photolithographic masks altered appropriately to overlay and match these non-regular areas.

The variables that are under fabrication process control are recognized in the present invention for the optimization of the multi-microlens structures to provide maximum adaptivity to dimensional variations in the photosensing areas to be imaged onto. These include, but are not limited to, layer thickness to adjust microlens curvature and/or rheological and thermal flow properties, depth of pn-junctions, color-filter layer formation sequencing, etch steps, photomask compensations, and, particularly microlens shapes, ranging from conics of spherical to elliptical, cylindrical, a spheric, and/or the use of Fresnel zone plate or holographic microlenses.

The process of the present invention has been tried experimentally and has been proven to result in superior optical collection in the cases of L-shaped and non-regular photosensor areas. FIGS. 8(A–D) demonstrate is a photograph of the L-shaped case, and, FIGS. 9(A–D) demonstrate is a photograph of the more general non-regular case.

While the invention has been particularly shown and described with reference to the preferred embodiments thereof, it will be understood by those skilled in the art that various changes in form and details may be made without departing from the spirit and scope of the invention.

What is claimed is:

1. A multi-microlens array structure for a semiconductor array imaging device, comprising:
    an array of photosensor areas in a semiconductor substrate, wherein said photosensor areas are L-shaped; and
    an array of multilenses over said photosensor areas, wherein each of said multilenses is aligned vertically with one of said photosensor areas, and images a shape similar to said photosensor areas.

2. The structure of claim 1, wherein said array of multilenses comprise two piece multilenses aligned vertically with the respective said two pieces of said two piece L-shaped photosensor areas.

3. The structure of claim 1 wherein each multilens element of the multi-microlens array is comprised of at least 2 coplanar microlens elements.

4. The structure of claim 1 wherein each multilens element of the multi-microlens array is comprised of at least 2 non-coplanar, vertically aligned multilens elements residing in either contiguous or non-contiguous planes, enabling the formation of compound lenses of increased numerical aperture and related light collection efficiency.

5. The structure of claim 4 wherein the multilens elements of the non-coplanar, vertically aligned multi-microlens arrays is further comprised of different shapes, sizes, lens types or material's properties such as refractive index.

6. The structure of claim 1 wherein each multilens element of the multi-microlens array is comprised of crossed-cylinder lenses, said cross-cylinder lenses being coplanar or non-coplanar.

7. The structure of claim 1 further comprising color filter layers vertically intermediate between said arrays of multi-microlenses and said photosensor areas.

8. The structure of claim 1 wherein said semiconductor image device is selected from the group consisting of a charge-coupled device, a charge-injection device and a photodiode array device.

9. The structure of claim 1 wherein a planarization layer covers and/or encapsulates the array of multi-microlenses.

10. The structure of claim 9 wherein the planarization layer comprises anti-reflection material.

11. The structure of claim 4 wherein the non-coplanar multilens arrays are further comprised of color filter layers vertically intermediate between said arrays.

12. A method of manufacturing multi-microlens arrays for a semiconductor array imaging device, comprising:
    forming an array of photosensor areas in a semiconductor substrate, wherein said photosensor areas are L-shaped; and
    forming an array of multilenses over said photosensor areas wherein each of said multilenses is aligned vertically with one of said photosensor areas, and images a shape similar to said photosensor areas.

13. The method of claim 12, wherein each of said multilenses is formed of at least 2 coplanar multilens elements and/or at least 2 non-coplanar multilens elements.

14. The method of claim 12 wherein each of said multilenses is formed of at least 2 coplanar multilens elements.

15. The method of claim 14 further comprising the formation of color filter layers over said arrays of photosensors and under or over said arrays of multilenses.

16. The method of claim 12 wherein each of said multilens element of the multi-microlens arrays is formed of at least 2 non-coplanar, vertically aligned microlens elements, said elements residing in either contiguous or non-contiguous planes.

17. The method of claim 13 further comprising the formation of planarization and/or encapsulation layers above or intermediate between said coplanar and/or non-coplanar arrays.

18. The method of claim 17 wherein said planarization and/or encapsulation layers are comprised of anti-reflection materials.

19. The method of claim 18 wherein said anti-reflection planarization and/or encapsulation layers are further formed as patterned multilayer dielectric stacks.

20. The method of claim 15 wherein said color filter layers are formed of patterned multi-layer dielectric stacks.

21. The method of claim 12 for the embodiment of non-coplanar multilens formation wherein anti-reflection layers are varied and matched to each planar of multilenses according to their index of refraction.

22. The method of claim 12, wherein said array of multilenses comprise two piece multilenses aligned vertically with the respective said two pieces of said two piece L-shaped photosensor areas.

* * * * *